United States Patent [19]

Tenbrink et al.

[11] Patent Number: 5,183,553
[45] Date of Patent: Feb. 2, 1993

[54] METHOD OF FORMING A HIGH TEMPERATURE RESISTANT COPPER COATING ON AN INORGANIC DIELECTRIC

[75] Inventors: Detlef Tenbrink, Paderborn; Martin Bock, Berlin; Kurt Heymann, Berlin; Martin Rimkus, Berlin, all of Fed. Rep. of Germany

[73] Assignee: Schering Aktiengesellschaft, Berlin and Bergkamen, Fed. Rep. of Germany

[21] Appl. No.: 379,809

[22] Filed: Jul. 13, 1989

[30] Foreign Application Priority Data

Jul. 13, 1988 [DE] Fed. Rep. of Germany ....... 3824249

[51] Int. Cl.$^5$ .......................... C25D 5/54; C25D 5/00
[52] U.S. Cl. .................................... 205/162; 205/184; 205/206; 205/207; 205/917; 427/123; 427/405; 427/368; 427/372.2; 427/355; 427/367
[58] Field of Search ............ 427/368, 405, 123, 372.2, 427/367, 355; 204/30, 37.1, 38.4; 205/162, 184, 206, 207, DIG. 917

[56] References Cited

U.S. PATENT DOCUMENTS 4,285,782  8/1981  Waldrop et al. .................. 204/32 R
4,748,086  5/1988  Akoh ................................... 428/433

FOREIGN PATENT DOCUMENTS 62-207817  3/1988  Japan .

OTHER PUBLICATIONS

F. A. Lowenheim, Electroplating, McGraw-Hill Book Co., New York, 1978 pp. 93–98 and p. 194.

Primary Examiner—Shrive Beck
Assistant Examiner—Roy V. King
Attorney, Agent, or Firm—Michael J. Striker

[57] ABSTRACT

The method of forming a high temperature resistant copper coating on a ceramic and/or enamel substrate, includes the steps of chemically depositing a copper layer having a thickness of at least 3 μm on the substrate, heating the copper layer formed thereon at a temperature of from 200° to 450° C., mechanically treating the copper layer with brush and polishing means to consolidate an upper surface thereof and galvanically depositing an additional copper layer having a thickness of 3 μm on the upper surface. The high temperature resistant copper coating for the ceramic or enamel substrate can stand a higher thermal load for a longer time than similar conventional coatings and can act to rapidly dissipate heat generated by electronic components.

6 Claims, No Drawings

METHOD OF FORMING A HIGH TEMPERATURE RESISTANT COPPER COATING ON AN INORGANIC DIELECTRIC

BACKGROUND OF THE INVENTION

The invention relates to a method of forming a high temperature resistant copper coating on an inorganic dielectric, preferably ceramic and enamel substrates, by means of chemical or galvanic metal deposition. Methods of forming a copper coating on inorganic dielectrics by means of chemical or galvanic metal deposition are generally known.

Copper coated base materials such as ceramics and enamel coated metal bases, are used for producing electronic circuits and, preferably, for circuits which among others are used where a high heat conductivity is required or where they are subjected to elevated working temperatures.

The function of a high-energy substrate in electronics is to permit flow of a very high current through conducting paths. They also should enable rapid dissipation of heat losses from structural elements. Powerful semiconductors having a commutation current of about 100 A to this effect should be brased to such metallized substrates. A ceramic substrate having a copper coating or a copper coated enamel substrate having a metal core perform this dissipation better than lattice substrates with raised and firefixed thick layer of a conductive paste, because the thermal and electrical conductivity of pure copper is significantly better.

The drawback consists, however, in that the load-carrying capacity of the structural elements: substrate, chemically deposited copper—galvanically deposited copper is limited by a maximum temperature of 290° and, beside, can be kept at that temperature no more than about 10 min.

At higher temperatures or a longer thermal load, impurities contained therein such as especially liquid remnants, cause destruction of element connections as a result of formation of blowholes in metal coatings.

SUMMARY OF THE INVENTION

The object of the present invention is to provide a method of forming a copper coating on ceramic or enamel substrates which can withstand more continuous thermal load without formation of blowholes.

The object of the invention is achieved by providing a method of forming a high temperature resistant copper coating on an inorganic dielectric, preferably, on ceramic and enamel substrates, by means of chemical or galvanic deposition of a metal, in which the metal a copper coating having a thickness at least 3 $\mu$m is deposited on a substrate and heated to a temperature to 200°–450° C. Then the copper coating is mechanically treated, preferably with brushes or polishing elements to consolidate an upper surface of the coating. Then a copper coating having a thickness of at least 3 $\mu$m and preferably, 40–100 $\mu$m is galvanically deposited.

The copper coatings formed on ceramic and enamel substrates according to the invention surprisingly can withstand temperatures up to 500° and even more without formation of any blowholes. That permits their use in electronic circuits subjected to very high temperature during their operation and they can be used in high energy modules.

The present invention, together with other objects and advantages thereof, will be best understood from the following description of the preferred embodiment.

DESCRIPTION OF THE PREFERRED EMBODIMENT

The copper coating according to the invention is formed on substrates produced from widely known ceramics such as all kinds of aluminum oxide ceramics or aluminum nitride ceramics, or beryllium oxide and barium titanate ceramics. Usually, the ceramic substrates are subjected to a preliminary treatment, and then covered with a thin coating, preferably copper coating. However, nickel, cobalt or gold can be used as a backing layer.

Chemical and galvanic deposition of copper is carried out in conventional baths under usual conditions.

The chemically deposited copper layer is subjected to a mechanical treatment with different means for closing pores in the upper surface of the copper coating. In particular, the upper surface of the coating is consolidated by brushing it with a brush with subsequent polishing of the coating upper surface. Thus, the upper surface of the coating, i.e., may be treated with a rotatable copper wire brush which provides light polish and consolidates the soft material.

Advantageously, the treatment is conducted with addition of water or, alternatively, polishing of the upper surface is effected with suitable means. I.e., for polishing, precipitating chalk, calcium- and magnesium carbonate as well as glass beads having a diameter of 50 $\mu$m can be used. The used material should not have bodies with sharp edges.

Polishing can be effected by hand or a machine with a nylon brush.

The study of the upper surface of a copper coating, obtained according to the invention, under an electronic microscope shows that the upper surface of a chemically deposited copper treated with a brush looks squamous. Study of upper surface microsection under an optical microscope shows that the metal texture, when treated with a brush, is effected only to a depth of 0.5–3 $\mu$m. By subsequent polishing, scaling is smoothed out, and the surface becomes free of pores so that, at the preliminary treatment and beginning of the galvanic deposit, no aqueous deposits penetrate into it.

As an alternative to brushing and polishing, a nonabrasive treatment with glass beads or vegetable granules can be used. Also, polishing with balls may be envisaged.

The main thing is to smooth out the surface of the chemically deposited copper coating by mechanical treatment which constitutes an important step of the method of the invention which results in unexpected advantages.

The invention will be further explained by way of examples.

EXAMPLE 1

A waffer made of an aluminum oxide ceramics and having a chemically deposited copper coating with a thickness of 10 $\mu$m was tempered at 323° C. under a protective gas. Then it was brushed with a rotatable copper wire brush and underwent wet brush finish. Finally, this typical for power electronic circuits structure with a metal surface of several square centimeters underwent etching.

EXAMPLE 2

A waffer made of an aluminum oxide ceramics and having a chemically deposited copper coating with a thickness of 10 μm was tempered at 323° C. under a protective gas. Then it was brushed with a rotatable copper wire brush and underwent wet brush finish. After additional chemical deposition of 10 mm copper layer, it was again under the same conditions brushed with a copper wire brush and underwent wet brush finish. The same structure as in Example 1 was obtained.

EXAMPLE 3

A waffer made of an aluminum oxide ceramics and having a chemically deposited copper coating with a thickness of 10 μm was tempered at 323° C. under a protective gas. Then it was brushed with a rotatable copper wire brush and underwent wet brush finish. Then it was polished by hand with 50 μm glass beads. Thereafter, a 50 μm copper layer was galvanically deposited. Then the structure as in Example 1 was etched.

EXAMPLE 4

A waffer made of an aluminum oxide ceramics and having a chemically deposited copper coating with a thickness of 10 μm was tempered at 323° C. under a protective gas. Then it was brushed with a rotatable copper wire brush and underwent wet brush finish. Then it was polished by hand with a conventional tooth paste. On the so treated metal surface, a 100 μm copper layer was galvanically deposited, and the structure as in Example 1 was etched.

EXAMPLE 5

A waffer made of an aluminum oxide ceramics and having a chemically deposited copper coating with a thickness of 10 μm was tempered at 323° C. under a protective gas. Then it was brushed with a rotatable copper wire brush and underwent wet brush finish. Then it was polished by hand with a conventional tooth paste. After covering with, exposure and development of a photoresist, the developed areas were covered with 40 μm copper layer, 2 μm nickel layer, and 1 μm gold layer. After the removal of the photoresist, a 10 μm adhesive layer was etched.

EXAMPLE 6

A waffer made of an aluminum oxide ceramics and having a chemically deposited copper coating with a thickness of 10 μm was tempered at 400° C. under a protective gas and was subjected to treatment with nutshell granules. Thereafter, the coating was treated as in Example 5.

The substrates obtained as described in Examples 1-6, were subjected to a blowhole formation test for about 5 minutes at 400° C. After the test, the coating remained blowhole-free. Similar results were obtained at flux-free soldering under simplified conditions and temperatures 290°-410° C.

The invention described herein is not intended to be limited to the details described, since various modifications may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A method of forming a high temperature resistant copper coating on an inorganic dielectric selected from the group consisting of ceramic and enamel substrates, comprising the steps of:
   a. chemically depositing a copper layer having a thickness of at least 3 μm on said inorganic dielectric;
   b. heating the copper layer at a temperature of from 200° to 450° C.;
   c. mechanically treating the copper layer with brush and polishing means to consolidate an upper surface thereof;
   d. galvanically depositing an additional copper layer having a thickness of at least 3 μm.

2. A method as set forth in claim 1, wherein said thickness of said additional copper layer is from 40 to 100 μm.

3. A method as set forth in claim 1, wherein said mechanically treating of said copper layer includes polishing with paste.

4. A method as set forth in claim 1, wherein said mechanically treating of said copper layer includes polishing by machine with a nylon brush.

5. A method as set forth in claim 1, wherein said ceramic substrates are selected from the group consisting of aluminum oxide ceramics, aluminum nitride ceramics, beryllium oxide ceramics and barium titanate ceramics.

6. A method as set forth in claim 1, wherein said polishing means are selected from the group consisting of chalk, calcium carbonate, magnesium carbonate and glass beads.

* * * * *